United States Patent
Watanabe et al.

(10) Patent No.: US 7,336,782 B2
(45) Date of Patent: Feb. 26, 2008

(54) WIRING STRUCTURE FOR FOLDING PORTABLE DEVICE

(75) Inventors: Yosuke Watanabe, Tokyo (JP); Masatomo Mizuta, Tokyo (JP); Mitsuru Sendoda, Tokyo (JP); Koji Matsunaga, Tokyo (JP); Takeshi Komatsu, Tokyo (JP)

(73) Assignee: NEC Corporation (JP)

( * ) Notice: Subject to any disclaimer, the term of this patent is extended or adjusted under 35 U.S.C. 154(b) by 777 days.

(21) Appl. No.: 10/730,328

(22) Filed: Dec. 8, 2003

(65) Prior Publication Data

US 2004/0224729 A1    Nov. 11, 2004

(30) Foreign Application Priority Data

Dec. 6, 2002    (JP) .............................. 2002-354554

(51) Int. Cl.
*H04M 9/00* (2006.01)
*H04M 1/00* (2006.01)

(52) U.S. Cl. .......................... 379/433.13; 379/433.05; 455/575.3

(58) Field of Classification Search ........... 379/433.11, 379/433.13, 433.04, 434; 455/575.3, 575.4, 455/90.3; 16/221, 366–367, 342
See application file for complete search history.

(56) References Cited

U.S. PATENT DOCUMENTS

| | | | | |
|---|---|---|---|---|
| 6,742,221 B2 * | 6/2004 | Lu et al. ........................ | 16/367 |
| 6,804,861 B2 * | 10/2004 | Hsu .............................. | 16/366 |
| 7,055,219 B2 * | 6/2006 | Shiba ........................... | 16/367 |
| 7,136,687 B2 * | 11/2006 | Chang ........................ | 455/575.3 |
| 7,158,816 B1 * | 1/2007 | Mizuta et al. ............ | 455/575.3 |
| 2002/0155740 A1 | 10/2002 | Sawada et al. | |
| 2003/0064758 A1 * | 4/2003 | Mizuta et al. .............. | 455/566 |
| 2004/0192422 A1 * | 9/2004 | Watanabe et al. ........ | 455/575.3 |
| 2004/0248628 A1 * | 12/2004 | Taninai ..................... | 455/575.3 |

FOREIGN PATENT DOCUMENTS

| | | | |
|---|---|---|---|
| JP | 9-153931 | | 6/1997 |
| JP | 11-215218 | | 8/1999 |
| JP | 2000240636 A | * | 9/2000 |
| JP | 2002190364 | | 7/2002 |
| JP | 2002-300247 | | 10/2002 |
| JP | 2004204950 | | 7/2004 |
| WO | WO 01/84729 A1 | | 11/2001 |

\* cited by examiner

*Primary Examiner*—Curtis Kuntz
*Assistant Examiner*—Phylesha L Dabney
(74) *Attorney, Agent, or Firm*—Ostrolenk, Faber, Gerb & Soffen, LLP

(57) ABSTRACT

A wiring device is used in a folding portable device including a hinge unit permitting an upper unit to fold/unfold and/or to rotate with regard to a lower unit. The wiring device comprises a rotative direction wound portion having a first central axis corresponding to a rotating axis of the hinge. A folding/unfolding direction wound portion has a second central axis corresponding to a folding/unfolding axis of the hinge. A FPC fixing member fixes a FPC holding member holding a predetermined part of a FPC to the hinge. The rotative direction wound portion is wound with a first part of a flexible printed cable that is continuous with one end of the predetermined part. The folding/unfolding direction wound portion is wound with a second part of the flexible printed cable that is continuous with the other end of the predetermined part.

20 Claims, 12 Drawing Sheets

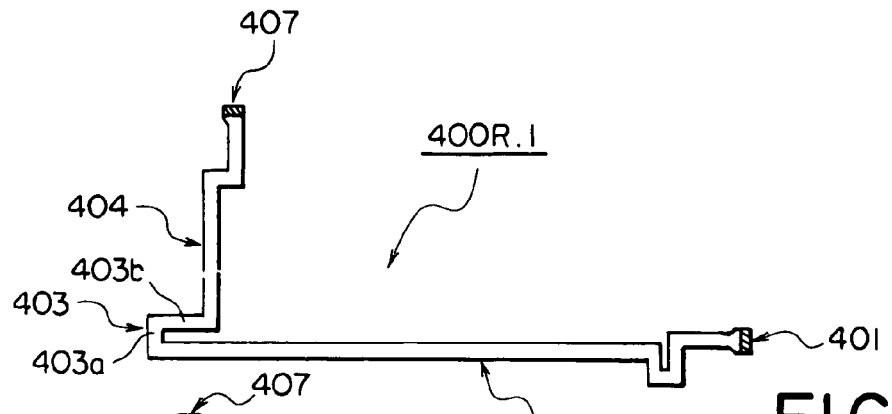
FIG. 7A
FIG. 7B
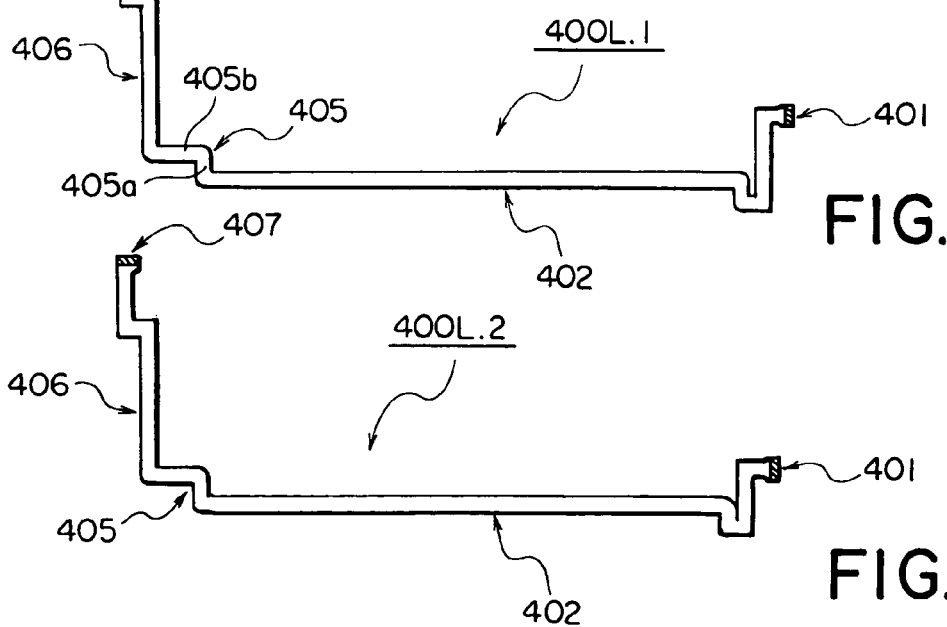
FIG. 7C
FIG. 7D

WIRING STRUCTURE FOR FOLDING PORTABLE DEVICE

This application claims priority to prior application JP 2002-354554, the disclosure of which is incorporated herein by reference.

BACKGROUND OF THE INVENTION:

This invention relates to a folding portable (or hand-held) device that has upper and lower units coupled to each other with a hinge mechanism having a folding/unfolding axis and a rotating axis perpendicular to the folding/unfolding axis. Particularly, this invention relates to a wiring structure used in the folding portable device together with the hinge mechanism.

Recently, most of mobile phones have various additive functions, such as a browser, a mailer, a personal information scheduler and the like. The mobile phone is increasingly becoming sophisticated as a portable information terminal. Accordingly, a larger display for the mobile phone is required to display letters, characters (or ideographs), numerals, a static image(s) and/or a moving image(s). Meanwhile, there is a demand for weight saving and miniaturizing of the mobile phone.

Employing a folding structure can meet the above-mentioned incompatible demands in a measure. An existing folding mobile phone comprises upper and lower units and a hinge mechanism which couples the units to each other. In the existing folding mobile phone, a display is provide in the upper unit while a key set is provided in the lower unit. The display and the key set come close to each other, as the upper and the lower units are unfolded by means of the hinge mechanism. When the upper and the lower units are completely unfolded, the display and the key set are hidden by them.

A certain type (hereinafter referred to as a rotatable type) of the existing folding mobile phone can expose the display even when the upper and the lower units are completely folded. This is accomplished by, for example, using a ball joint as the hinge mechanism. The ball joint enables the upper unit to be rotated with respect to the lower unit. The rotatable type folding mobile phone allows a user to use the browser, the mailer or the like when the upper and the lower units are folded. Such a rotatable folding mobile phone is disclosed in Japanese Unexamined Patent Publication (JP-A) No. Tokkaihei 11-215218.

Now, a serious matter is a wiring structure between the upper unit and the lower unit of the rotatable folding mobile phone. That is, the wiring structure must have durability and a smaller size. However, the above mentioned document does not teach or suggested about the wiring structure.

Additionally, a personal information terminal employing a structure like the rotatable folding mobile phone needs a manner to allow of compact housing of signal lines, which amount to dozens or about a hundred.

SUMMARY OF THE INVENTION

It is therefore an object of this invention to provide a wiring structure capable of having durability and of being compactly incorporated in a hinge mechanism having a folding/unfolding axis and a rotative axis.

Another object of this invention is to provide a wiring structure capable of having a large number of signal lines and of being compactly incorporated in a hinge mechanism having a folding/unfolding axis and a rotating axis.

Other objects of this invention will become clear as the description proceeds.

According to a first aspect of this invention, a wiring device is uses in a folding portable device including an upper unit, a lower unit and a hinge unit mechanically connecting the upper unit to the lower unit. The hinge unit has a rotating axis for rotating the upper unit in relation to the lower unit and a folding/unfolding axis perpendicular to the rotating axis for folding/unfolding the upper unit in relation to the lower unit. The said wiring device comprises a rotative direction wound portion having a first central axis corresponding to the rotating axis to be wound with a first part of a flexible printed cable which electrically connects the upper unit to the lower unit. A folding/unfolding direction wound portion has a second central axis corresponding to the folding/unfolding axis to be wound with a second part of the flexible printed cable.

According to a second aspect of this invention, a wiring device is used in a folding portable device including an upper unit, a lower unit and a hinge unit mechanically connecting the upper unit to the lower unit. The hinge unit has a rotating axis for rotating the upper unit in relation to the lower unit and a folding/unfolding axis perpendicular to the rotating axis for folding/unfolding the upper unit in relation to the lower unit. The wiring device comprises a rotative direction wound portion having a first central axis corresponding to the rotating axis to be wound with a first part of a flexible printed cable which electrically connects the upper unit to the lower unit. A folding/unfolding direction wound portion has a second central axis corresponding to the folding/unfolding axis to be wound with a second part of the flexible printed cable. A cable fixing portion fixes a third part between the first part and the second part of the flexible printed cable.

According to a third aspect of this invention, a wiring method is for wiring a flexible printed cable between an upper unit and a lower unit of a folding portable device. The upper unit and the lower unit are mechanically connected to each other by a hinge unit having a rotating axis for rotating the upper unit in relation to the lower unit and a folding/unfolding axis perpendicular to the rotating axis for folding/unfolding the upper unit in relation to the lower unit. The method comprises the steps of fixing a predetermined part of the flexible printed cable to the hinge unit, winding a first winding part of the flexible printed cable around a rotative direction wound portion having a first central axis corresponding to the rotating axis, and winding a second winding part of the flexible printed cable around a folding/unfolding direction wound portion having a second central axis corresponding to the folding/unfolding axis.

According to a fourth aspect of this invention, a folding portable device includes an upper unit, a lower unit and a hinge unit for mechanically connecting the upper unit to the lower unit. The hinge unit has a rotating axis for rotating the upper unit in relation to the lower unit and a folding/unfolding axis perpendicular to the rotating axis for folding/unfolding the upper unit in relation to the lower unit. The folding portable device comprises a flexible printed cable for electrically connecting the upper unit to the lower unit. A rotative direction wound portion has a first central axis corresponding to the rotating axis to be wound with a first part of the flexible printed cable around the rotating axis. A folding/unfolding direction wound portion has a second central axis to be wound with a second part of the flexible printed cable around the folding/unfolding axis.

BRIEF DESCRIPTION OF THE DRAWING

FIG. 7A is a plane view of a first example of a first type FPC in a spread state;

FIG. 7B is a plane view of a second example of the first type FPC in a spread state;

FIG. 7C is a plane view of a first example of a second type FPC in a spread state;

FIG. 7D is a plane view of a second example of the second type FPC in a spread state;

Figure 1:
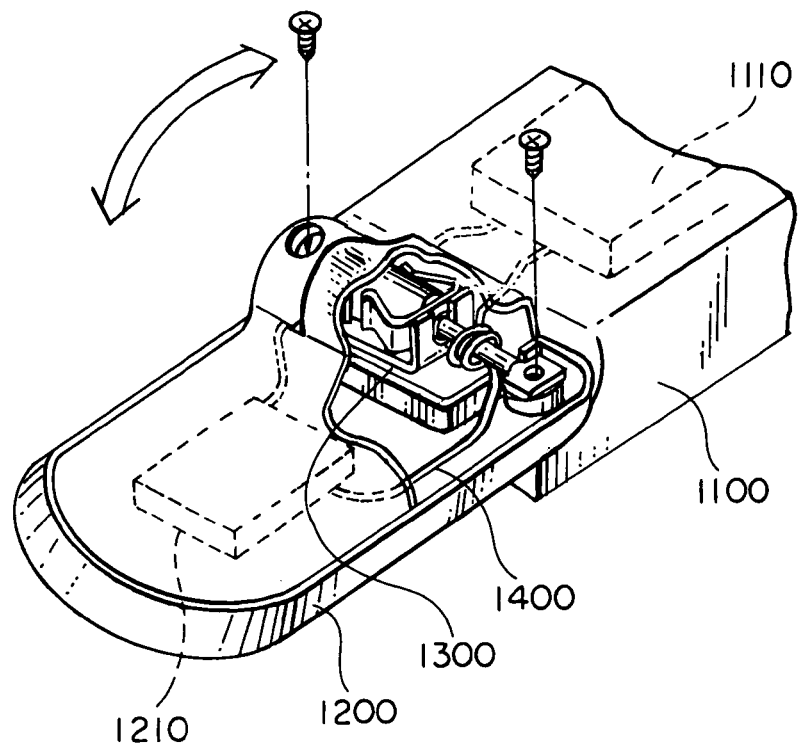
FIG. 1 shows a wiring structure of a conventional folding mobile phone.

DESCRIPTION OF THE PREFERRED EMBODIMENT:

Referring to FIG. 1, description will be first directed to a conventional wiring structure of a conventional mobile phone.

In FIG. 1, a folding mobile phone comprises a lower unit 1100 with a first circuit 1110 and an upper unit 1200 with a second circuit. The lower unit 1100 and the upper unit 1200 are mechanically connected to each other by the means of a hinge mechanism 1300 so that they are folded/unfolded in relation to each other. The first circuit 1110 and the second circuit 1210 are electrically connected to each other by signal lines 1400. The signal lines 1400 are loosely wound around a shaft of the hinge mechanism 1300 to make several turns at midpoints of them. Such a folding mobile phone is described in Japanese Unexamined Patent Publication (JP-A) No. Tokkaihei 9-153931.

Figure 2:
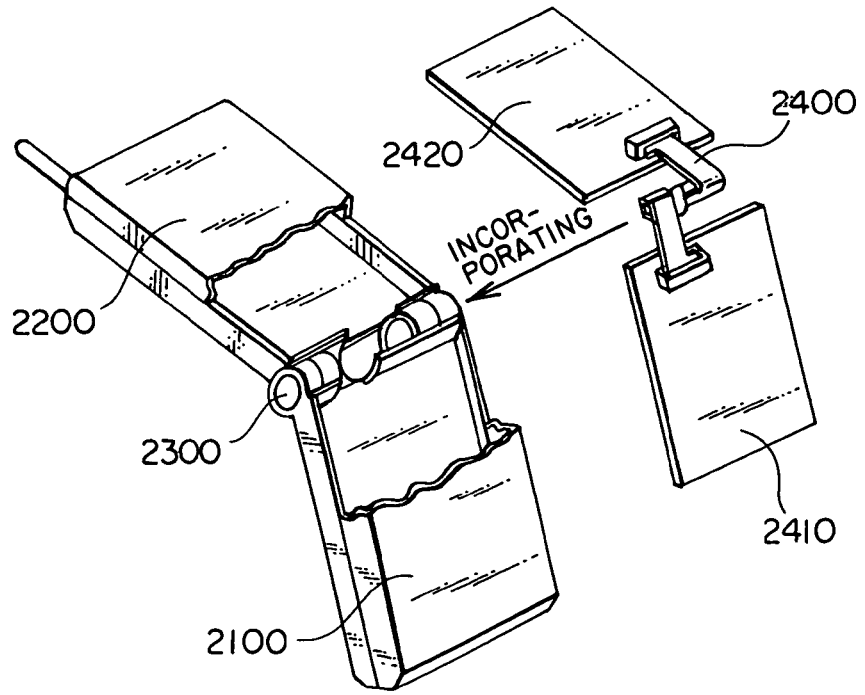
FIG. 2 shows another wiring structure of another conventional folding mobile phone.

Referring to FIG. 2, another conventional mobile phone comprises a flexible print circuit 2400 connecting a first circuit 2410 to a second circuit 2420. The flexible print circuit 2400 is wound at midpoint thereof and incorporated into a hinge mechanism 2300 mechanically connected between a lower unit 2100 and a upper unit 2200. Such a folding mobile phone is described in Japanese Unexamined Patent Publication (JP-A) No. Tokkai 2002-300247.

The conventional wiring structures mentioned above are available for the folding mobile phones. However, they are not available for a folding mobile phone having a two axes type hinge mechanism.

Referring to FIGS. 3A to 3D, description will be made about a folding mobile phone according to a preferred embodiment of this invention.

Figure 3A:
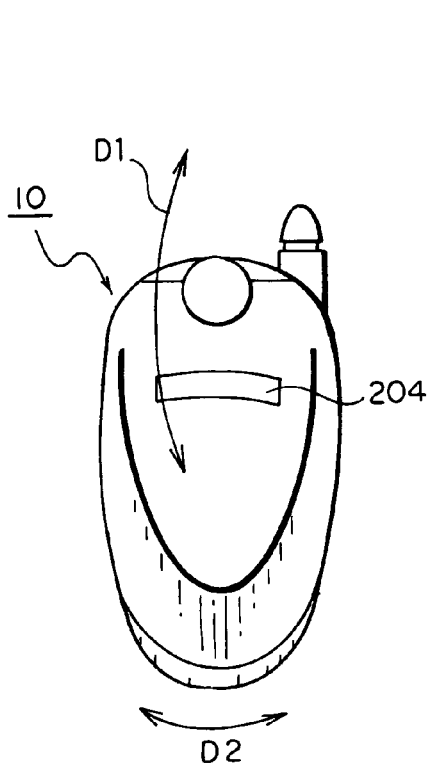
FIG. 3A is a plane view showing a normal folded position of a folding mobile phone according to a preferred embodiment of this invention.
Figure 3B:
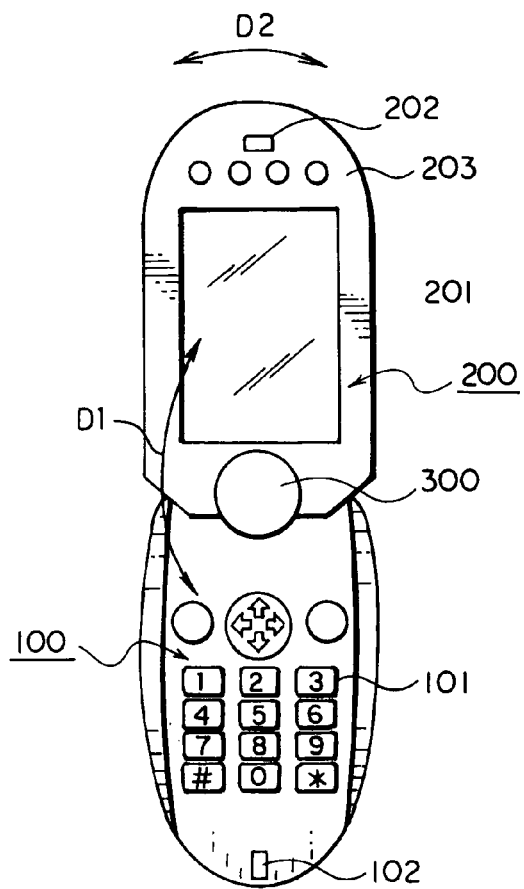
FIG. 3B is a plane view showing an unfolded position of the folding mobile phone of FIG. 3A.
Figures 3C, 3D:
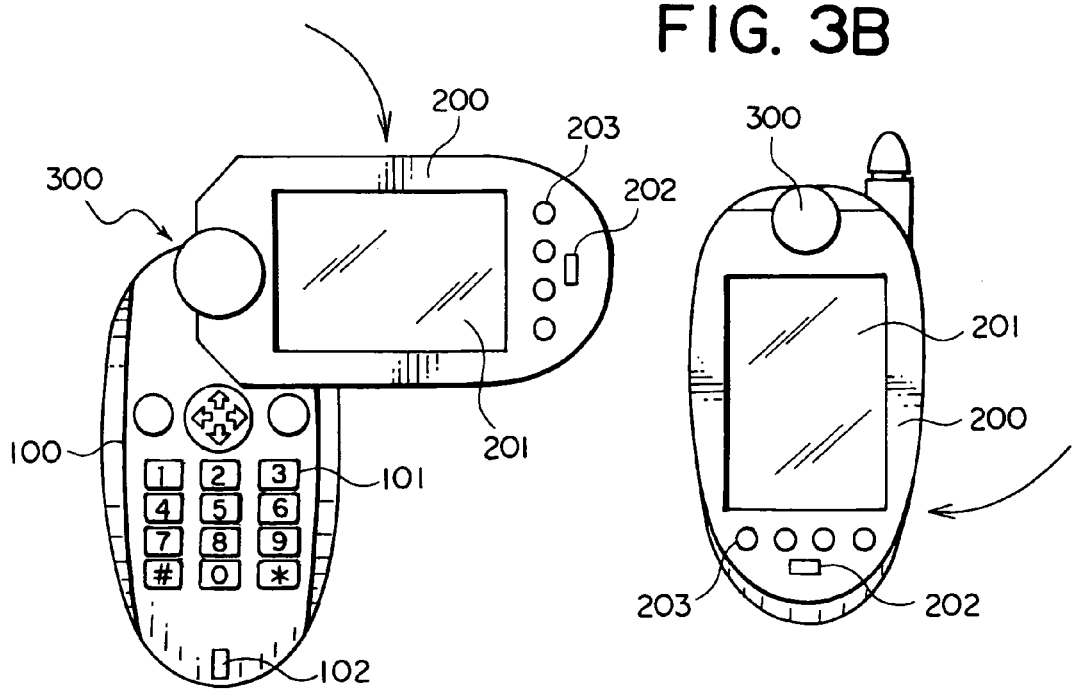
FIG. 3C is a plane view showing a transition state of the folding mobile phone of FIGS. 3A and 3B.
FIG. 3D is a plane view showing a reverse folded position of the folding mobile phone of FIGS. 3A to 3C.

FIG. 3A is a plane view showing a normal folded position of the folding mobile phone 10. FIG. 3B is a plane view showing an unfolded position of the folding mobile phone 10. FIG. 3C is a plane view showing a transition state of the folding mobile phone 10. FIG. 3D is a plane view showing a reverse folded position of the folding mobile phone 10.

As shown in FIGS. 3A to 3D, the folding mobile phone 10 comprises a lower unit 100, an upper unit 200 and a two axes type hinge portion 300 connecting the lower unit 100 and the upper unit 200 to each other. The hinge portion 300 enables the upper unit 200 to move with respect to the lower unit 100 in a folding/unfolding direction D1 and a rotative direction D2 as mentioned later. The lower unit 100 provides a key operating portion (or a key set) 101 including numeric keypads and a microphone 102 at a main surface thereof. The upper unit 200 provides an oblong (main) display 201, a speaker 202 and an assistant operating portion 203 at a main surface thereof.

In FIG. 3A, the lower unit 100 and the upper unit 200 are folded and their main surfaces confront each other in close proximity. Accordingly, the key operating portion 101 and the display 201 are hidden and protected by the lower and the upper units 100 and 200. The upper unit 200 further provides an assistant display 204 for display simple information.

The folding mobile phone 10 in the normal folded position of FIG. 3A goes into the unfolded of FIG. 3B when the upper unit 200 is moved in the unfolding direction D1 with respect to the lower unit 100. The hinge portion 300 restricts an unfolded angle between the main surfaces of the lower and the upper units 100 and 200 to about 180 degrees.

In FIG. 3B, the lower and the upper units 100 and 200 expose their main surfaces outside. That is, the key operating portion 101, the microphone 102, the display 201 and the speaker 202 can be seen from the outside. The unfolded position allows the user to operate the key operating portion 101 and to speak by the folding mobile phone 10. The hinge portion 300 may limit the unfolded angle to about 160-170 degrees in the unfolded position.

The hinge portion 300 enables the upper unit 200 to rotate in the rotating direction D2 with respect to the lower unit 100. Furthermore, the hinge portion 300 restricts a rotation angle of the upper unit 200 to about 180 degrees in each of clockwise and counterclockwise directions from the unfolded position of FIG. 3B. Thus, the folding mobile phone 10 in the unfolded position of FIG. 3B can go into the reverse folded position of FIG. 3D via the transition state illustrated in FIG. 3C. The hinge portion 300 may increase the unfolded angle between the main surfaces of the lower and the upper units 100 and 200 to 180 degrees during the transition from the unfolded position of FIG. 3B to the reverse folded position of FIG. 3D.

The hinge portion 300 has stable positions (or click positions) for the normal folded position of FIG. 3A, the unfolded position of FIG. 3B and the reverse folded position of FIG. 3C. The hinge portion 300 may have one or more additional stable positions between the normal folded position and the reverse folded position.

In FIG. 3C, the upper unit 200 is rotated at 90 degrees from the unfolded position of FIG. 3B. The hinge portion 300 may maintain the unfolded angle of about 160-170 degrees between the main surfaces of the lower and the upper units 100 and 200 in the transition state of FIG. 3C. Alternatively, the hinge portion 300 may increase the unfolded angle to about 180 degrees in the transition state of FIG. 3C. At any rate, the hinge portion 300 sets the angle at 180 degrees in the reverse folded state of FIG. 3D.

In FIG. 3D, the upper unit 200 is positioned on the main surface of the lower unit 100 while the display 201 is oriented outside. The main surfaces of the lower and the upper units 100 and 200 are substantially parallel to each other.

Figure 4:
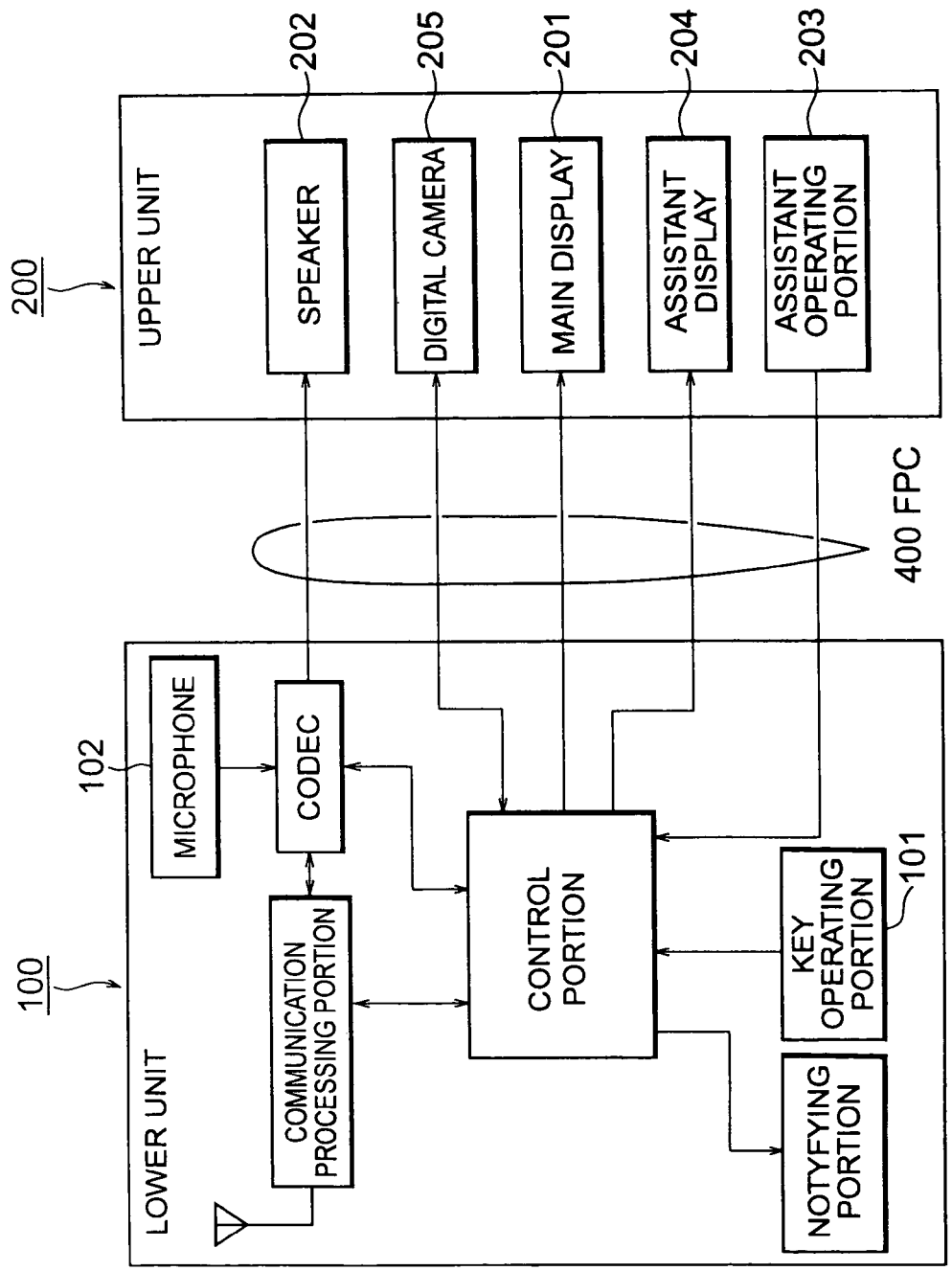
FIG. 4 is a block diagram showing an internal composition of the holding mobile phone of FIGS. 3A to 3D.

Referring FIG. 4, the description is directed to an internal composition of the folding mobile phone 10.

In FIG. 4, the lower unit 100 comprises a communication processing portion, a coder decoder (CODEC), a notifying portion and a control portion except for the key operating portion 101 and the microphone 102. The upper unit 200 may comprise a digital camera 205. The lower unit 100 and upper unit 200 are electrically connected to each other by a flexible printed circuit or cable (FPC) 400.

The FPC 400 includes a plurality of signal lines (or printed wires). The number of signal lines depends on functions of the folding mobile phone 10. The signal lines become large in number when the functions are improved and/or become large in number. Accordingly, the FPC 400 must be compactly housed in the hinge portion 300. In addition, the FPC 400 must have durability against motion of the hinge portion 300.

Next, referring to FIGS. 5 and 6, the description will be made about a hinge mechanism (or a wiring device) included in the hinge portion 300.

Figure 5:
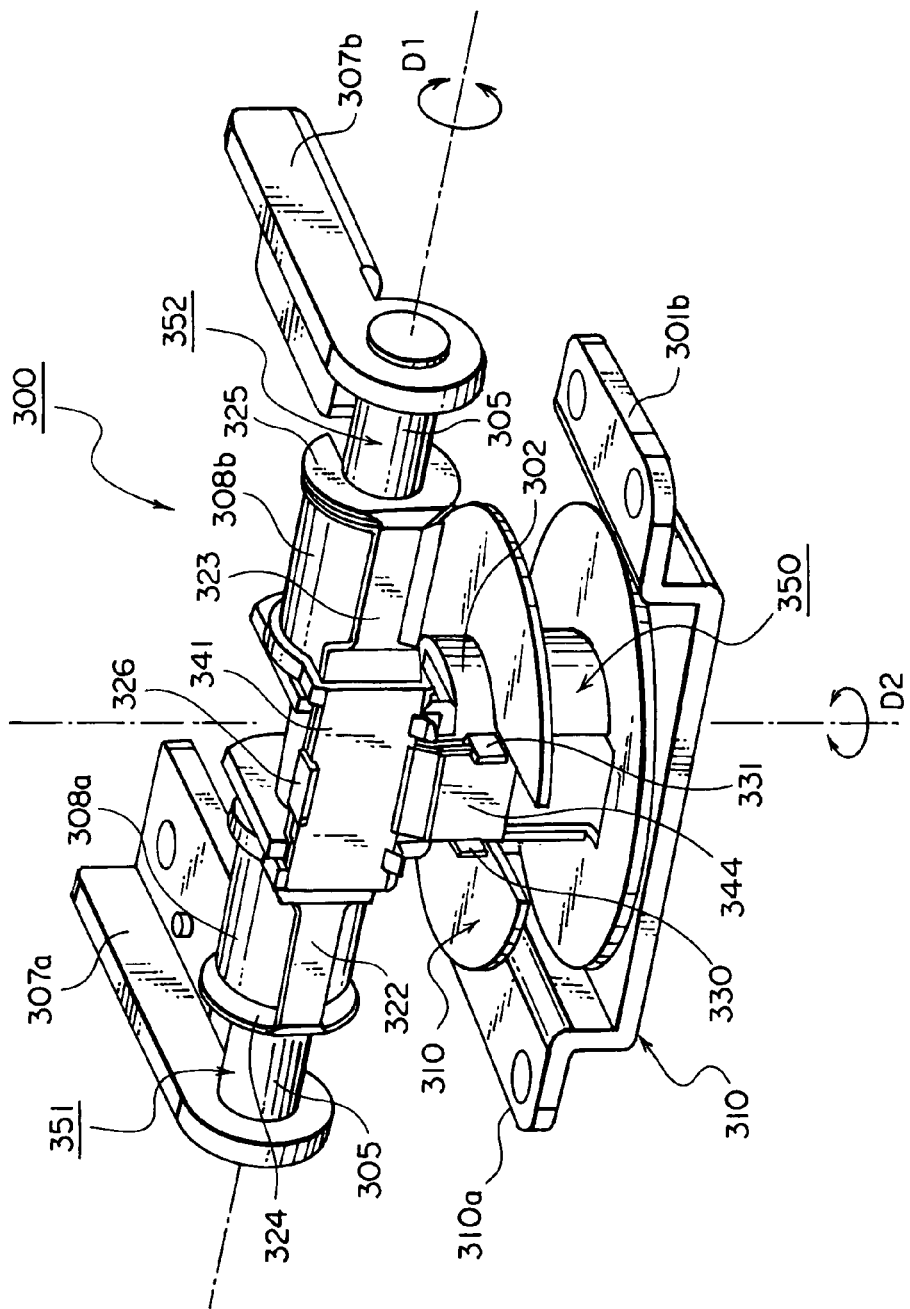
FIG. 5 is an oblique perspective view of a hinge mechanism used in a hinge portion of the holding mobile phone of FIGS. 3A to 3D.

FIG. 5 is an oblique perspective view of the hinge mechanism. FIG. 6 is an exploded perspective view of the hinge mechanism. As shown in FIG. 6, the hinge mechanism of the hinge portion 300 comprises a hinge unit 300a as a main body of the wiring device to which a bobbin 310, an FPC holding member 320 and FPC fixing member 340 are attached.

Figure 6:
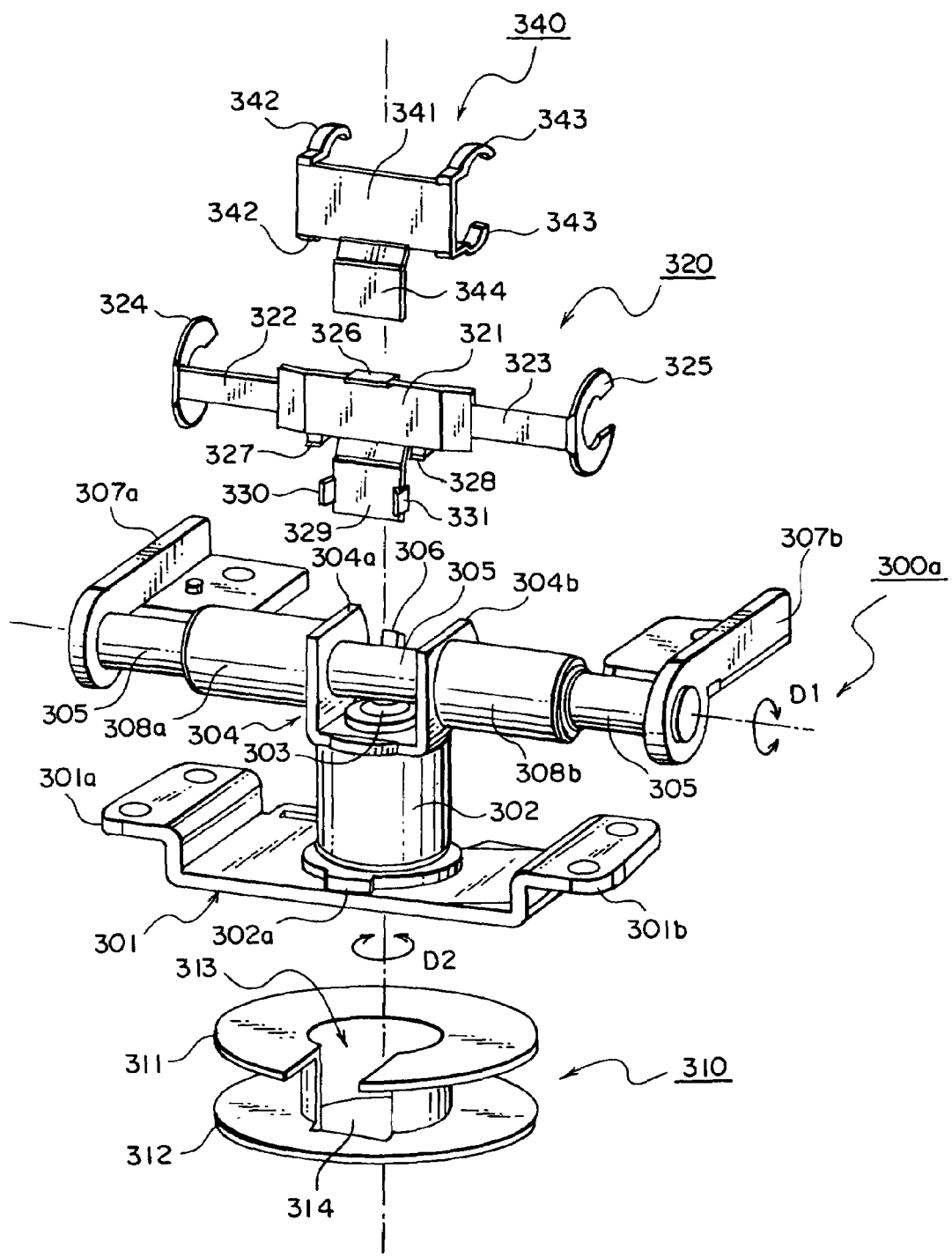
FIG. 6 is an exploded perspective view of the hinge mechanism of FIG. 5.

In FIG. 6, the hinge unit 300a includes a base plate 301 with brackets 301a and 301b at both ends thereof. The base plate 301 is fixed to the lower unit 100. A rotation resistance-generating portion 302 is provided at the middle of an upper surface of the base plate 301. The rotation resistance-generating portion 302 has a control jut 303 to control an unfolded angle of the folding mobile phone 10. A U-shaped coupling bracket 304 having a pair of side plates 304a and 304b is rotatably connected to the rotation resistance-generating portion 302.

Specifically, the control jut 303 is fixed to a rigid shaft (not shown) included in the rotation resistance generating portion 302. The rigid shaft is fixed to the base plate 301 so that its central axis coincides with a rotative axis. The coupling bracket 304 has a bottom portion fixed to an outer case (or a hollow cylindrical member) of the rotation resistance generating portion 302. The control jut 303 penetrates the bottom portion of the coupling bracket 304 at the middle of the bottom portion to permit the coupling bracket 304 to rotate on the rigid shaft (or the rotation axis) in the rotative direction D2 together with the outer case of the rotation resistance generating portion 302. In other words, the coupling bracket 304 can rotate in the rotating direction D2. The rotation resistance-generating portion 302 generates resistance to rotation of the outer case in relation to the rigid shaft to give a user a click feeling and/or sense of stability.

The rotation resistance-generating portion 302 further has a projection 302a projecting outward at a lower end of the outer case thereof. The projection 302a stops the outer case from rotating together with a stopper (not shown) provided to the base plate 301 at the backside of the figure. That is, the projection 302a limits the rotation angle within about 360 degrees in the direction D2.

The coupling bracket 304 rotatably supports a folding/unfolding shaft 305 which penetrates the side plates 304a and 304b. The folding/unfolding shaft 305 can rotate on its central axis (or a folding/unfolding axis) in the folding/unfolding direction D1.

A pair of stoppers (only one shown) 306 are fixed on a peripheral surface of the folding/unfolding shaft 305 at the middle between the side plates 304a and 304b. Either of the stoppers 306 strikes the control jut 303 to stop the folding/unfolding shaft 305 from rotating. One of the stoppers 306 can be partially inserted in a recess (not shown) formed in the control jut 303 having a truncated conical shape. When one stopper 306 is partially inserted in the recess of the control jut 303, the coupling bracket 304 (or the upper unit 200) can not rotate in the rotating direction D2.

Additionally, FIGS. 5 and 6 show the position that the upper unit 200 and the lower unit 100 are folded as illustrated in FIG. 3A. In the normal folded position, the upper unit 200 con not rotate in the rotative direction D2 because one stopper 306 on the folding/unfolding shaft 305 is partially inserted in the recess of the control jut 303.

At both ends of the folding/unfolding shaft 305, L shaped brackets 307a and 307b are provided to be fixed to the upper unit 200. The L shaped brackets 307a and 307b have portions which serve as flanges at the ends of the folding/unfolding shaft 305.

On the side plates 304a and 304b of the coupling bracket 304, folding/unfolding resistance generating portions 308a and 308b similar to the rotation resistance-generating portion 302 are provided. The folding/unfolding shaft 305 penetrates the folding/unfolding resistance generating portions 308a and 308b. The folding/unfolding resistance generating portion 308a and 308b generate resistance to rotation of the folding/unfolding shaft 305 to give the user a click feeling and/or sense of stability.

The hinge unit 300a mechanically connects the upper unit 200 to the lower unit 100.

Next, the description will be made about attaching mechanism of the FPC 400 for electrically connecting the upper unit 200 to the lower unit 100. The FPC attaching mechanism includes the bobbin 310, the FPC holding member 320 and the FPC fixing member 340.

The bobbin 310 comprises an incomplete hollow cylinder and winding guides 311 and 312 at both ends of the incomplete hollow cylinder. The incomplete hollow cylinder of the bobbin 310 is fixed to the rotation resistance generating portion 302 housed therein. The bobbin 310 can rotate together with the outer case of the rotation resistance generating portion 302 (or the upper unit 200) in the rotating direction D2. A notch 314 is formed in the winding guides 311 and the incomplete hollow cylinder of the bobbin 310.

The FPC 400 has a first part loosely wound around the hollow cylinder of the bobbin 310 and a second part continuous with the first part via a third part. The second and third parts of the FPC 400 are drawn out toward the coupling bracket 304 through the notch 314. A shape of the FPC 400 will be mentioned later.

The bobbin 310 prevents the first portion of the FPC 400 from sliding along the rotation axis by means of the winding guides 311 and 312. When the bobbin 310 is made of resin, rubber or the like, the FPC 400 can avoid damage caused by contacting with a metal member of the hinge unit 300a. With rotation of the bobbin 310 (or the upper unit 200), the first portion of the FPC 400 is tightened or loosened. The first portion of the FPC 400 is apart from other parts of the folding mobile phone 10 except the bobbin 310 even if the bobbin 310 rotates.

The FPC holding member 320 has a T shaped form corresponding. to a combination of the rotating axis and the folding/unfolding axis. The FPC holding member 320 comprises a holding plate 321 and guide arms 322 and 323 extending from side ends of the holding plate 321 along the folding/unfolding shaft 305. The guide arms 322 and 323 provide guide plates 324 and 325 perpendicular to the guide arms 322 and 323. The guide plates 324 and 325 have C shaped form and freely engage the folding/unfolding shaft 305 at outer sides of the folding/unfolding resistance generating portions 308a or 308b to support the FPC holding member 320.

The holding plate 321 provides an upper hook 326 and a pair of lower hooks 327 and 328 to guide the third portion of the FPC 400 and to fix the FPC fixing member 340. At lower edge of the holding plate 321, a guide plate 329 is provided. The guide plate 329 has a pair of side hooks 330 and 331 to guide the third portion of the FPC 400 and to fix the FPC fixing member 340.

The fixing member 340 includes a pressing plate 341 opposed to the holding plate 321 of the FPC holding member 320 to sandwich a corresponding part of the FPC 400 between them. The fixing member 340 provides clips 342 and 343 at both sides thereof to clip or grip outer cases of the folding/unfolding resistance generating portion 308a and 308b. At lower edge of the pressing plate 341, another pressing plate 344 is provided to be opposed to the guide plate 329 and to sandwich a corresponding part of the FPC 400 between them.

Turning to FIG. 5, the fixing member 340 is fixed to the FPC holding member 320 by the means of hooks 326-328, 330 and 331. The guide plates 324 and 325 receive the folding/unfolding shaft 305 while the clips 342 and 343 clip the folding/unfolding resistance generating portions 308a and 308b over the holding plate 321, thereby the combination of the fixing member 340 and the FPC holding member 320 is attached to the hinge unit 300a.

The bobbin 310 serves as a rotative direction wound portion 350 which is wound with the first portion of the FPC 400 and which is rotatable in the rotative direction D2. That is, the central axis of the bobbin 310 substantially coincides with the rotative axis. The guide plate 324, the flange portion of the L shaped bracket 307a and an end portion of the folding/unfolding shaft 305 serves as a left-hand folding/unfolding direction wound portion 351 which is wound with a fourth portion of the FPC 400 like the second portion of the FPC 400. Similarly, the guide plate 325, the flange portion of the L shaped bracket 307b and the other end portion of the folding/unfolding shaft 305 serves as a right-hand folding/unfolding direction wound portion 352 which is wound with the second portion of the FPC 400. The guide plates 324, 325 and the L shaped brackets 307a and 307b serve as winding guides like the winding guides 311 and 312. The central axis of the folding/unfolding shaft 305 substantially coincides with the folding/unfolding axis.

The rotative direction wound portion 350 of the bobbin 310 prevents the first portion of the FPC 400 from sliding along the rotation axis, thereby the FPC 400 can avoid being rubbed and/or bent by contact with the metal member of the hinge unit 300a. If the upper unit 200 rotates in relation to the lower unit 100, then the first portion of the FPC 400 merely receives small stress since it is tightened or loosened.

The FPC holding member 320 prevents the third portion of the FPC 400 from coming into contact with a moving part of the hinge unit 300a by means of the holding plate 321 and guide arms 322 and 323. In other words, the FPC holding member 320 keeps the third portion of the FPC 400 from coming in contact with the moving part of said hinge unit. Each of the folding/unfolding direction wound portions 351 and 352 prevents the second (or the fourth) portion of the FPC 400 from sliding along the folding/unfolding axis, thereby the second (or the fourth) portion of the FPC 400 can avoid being rubbed and/or bent by contact with the metal member of the hinge unit 300a. If the upper unit 200 and the lower unit 100 are unfolded, then the second (and/or the fourth) portion of the FPC 400 merely receive small stress since it is tightened or loosened.

Thus, the hinge mechanism prevents signal lines of the FPC 400 from being cut by rubbing with the hinge unit 300a. Furthermore, the hinge mechanism can lengthen a lifetime of the FPC 400.

The folding/unfolding shaft 305 may have thinner parts which are thinner than the other part thereof and used for the folding/unfolding direction wound portions 351 and 352. Use of the thinner shaft can make a winding diameter of the second (or four the) portion of the FPC 400 smaller and implement a small and thin design of the folding mobile phone 10.

The hinge structure can hold and fix a plurality of FPCs in a small way. Accordingly, when the many signal lines are necessary between the lower unit 100 and the upper unit 200, the signal lines can be divided in two or more groups for plural FPCs. The FPCs have shape as illustrated in FIGS. 7A-7D.

FIGS. 7A and 7B are plane views showing a spread state of first and second examples of the FPC having the second portion wound around the right-hand folding/unfolding direction wound portion 352. FIGS. 7C and 7D are plane views showing a spread state of first and second examples of the FPC having the forth portion, instead of the second portion, wound around the left-hand folding/unfolding direction wound portion 351.

In FIG. 7A, the FPC 400R.1 has a first connector 401 to be connected to a circuit board provided in the lower unit 100. A rotative axis winding part 402 (corresponding to the first part mentioned above) is for being wound around the rotative direction wound portion 350. A fixing part 403 (corresponding to the third part mentioned above) is for being fixed by the FPC holding member 320 and the FPC fixing member 340. A folding/unfolding axis winding part 404 (corresponding to the second part mentioned above) is for being wound around the right-hand folding/unfolding direction wound portion 350. A second connector 407 is for connecting with a circuit board provided in the upper unit 200.

The fixing part 403 includes a vertical part 403a to be extended from the bobbin 310 and sandwiched between the guide plate 329 and the pressing plate 344, and a horizontal part 403b to be sandwiched between the holding plate 321 and the pressing plate 341 and extended to the right-hand folding/unfolding direction wound portion 352 along the guide arm 323.

The length of the rotating axis winding part 402 is decided according to the number of turns and a diameter of the incomplete hollow cylinder of the bobbin 310. Similarly, the length of the folding/unfolding axis winding part 404 is decided according to the number of turns and a diameter of the folding/unfolding shaft 305. With regard to each portion 402 or 403, the number of turns is usually two or three.

In FIG. 7B, the FPC 400R.2 has the same structure as the FPC 400R.1 of FIG. 7A except shape of connector-side end portions of the rotating axis winding part 402 and the folding/unfolding axis winding part 404.

Referring to FIG. 7C, the FPC 400L.1 has a first connector 401 to be connected to the circuit board provided in the lower unit 100. A rotating axis winding part 402 is for being wound around the rotative direction wound portion 350. A fixing part 405 is for being fixed by the FPC holding member 320 and the FPC fixing member 340. A folding/unfolding axis winding part 406 (corresponding to the fourth part mentioned above) is for being wound around the left-hand folding/unfolding direction wound portion 351. A second connector 407 is for connecting with the circuit board provided in the upper unit 200.

The fixing part 405 includes a vertical part 405*a* to be extended from the bobbin 310 and sandwiched between the guide plate 329 and the pressing plate 344, and a horizontal part 405*b* to be sandwiched between the holding plate 321 and the pressing plate 341 and extended to the left-hand folding/unfolding direction wound portion 351 along the guide arm 322.

The length of the rotating axis winding part 402 and the folding/unfolding axis winding part 406 is decided like the FPC 400R.1 of FIG. 7A.

In FIG. 7D, the FPC 400L.2 has the same structure as the FPC 400L.1 of FIG. 7C except shape of connector-side end portions of the rotating axis winding part 402 and the folding/unfolding winding part 406.

Figure 8:
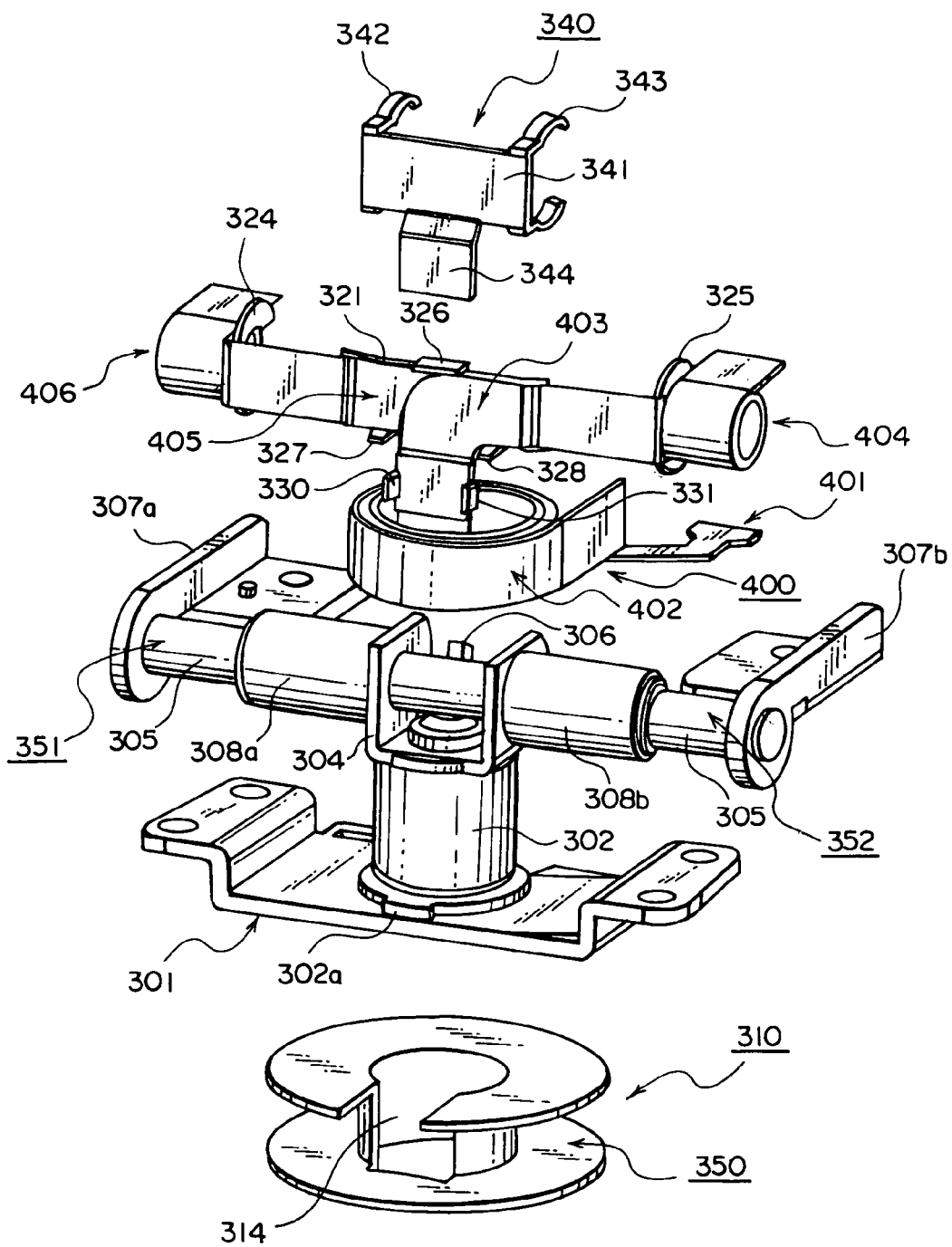
FIG. 8 is an exploded perspective view for describing process of attachment of the FPCs to the hinge mechanism shown in FIG. 5.

Referring to FIG. 8, the description will be made about a process for attaching two FPCs 400L.1 (or 400L.2) and 400R.1 (or 400R.2) to the hinge mechanism.

First, the FPCs 400L.1 and 400R.1 are partially placed on the holding plate 321 and the guide plate 329 so that one of the FPCs 400L.1 and 400R.1 is laid on the other in large part. The fixing member 340 is fixed to the holding member 320 by the means of hooks 326-328 and 330-331 so that the fixing portion 403 and 405 are sandwiched between the FPC holding member 320 and the FPC fixing member 340 and fixed by them. Specifically, the pressing plate 341 is fixed by the hooks 326-328 and the pressing plate 344 is fixed by the hooks 330 and 331.

Next, the resulting set of the FPC holding member 320, FPC fixing member 340 and FPCs 400L.1 and 400R.1 is attached to the hinge unit 300*a*. This is accomplished by fitting the guide plates 324 and 325 to the folding/unfolding shaft 305, and clipping the outer cases of the folding/unfolding resistance generating portions 308*a* and 308*b* with the clips 342 and 343. In this time, the holding member 320 prevents the FPCs 400L.1 and 400R.1 from coming into contact with the hinge unit. Accordingly, assembly is easy to be made.

Figure 9:
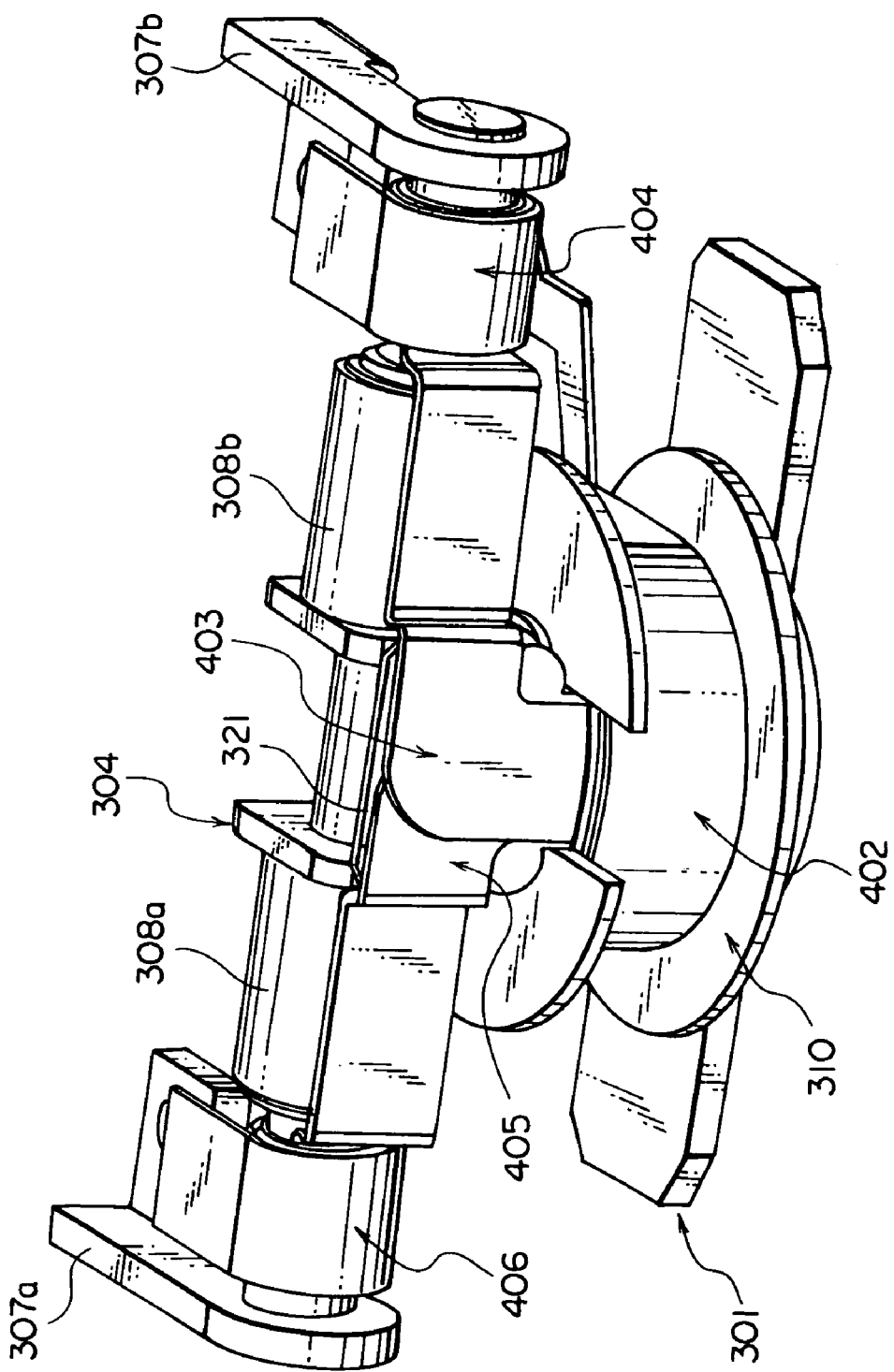
FIG. 9 is an oblique perspective view of a resulting wiring device with the FPCs attached to the hinge mechanism of FIG. 5.

While the set including the FPCs 400L.1 and 400R.1 is attached to the hinge unit 300*a*, the fixing parts 403 and 405 of the FPCs are partially put in the notch 314 of the bobbin 310 combined with hinge unit 300*a*. Accordingly, the rotating axis winding parts 402 of the FPCs 400L.1 and 400R.1 can be wound around the rotative direction wound portion 350 in this condition. The rotating axis winding parts 402 of the FPCs are loosely wound from the inner side to the outer side in a spiral shape around the rotative direction wound portion 350. Furthermore, the folding/unfolding axis winding part 406 of the FPC 400L.1 is loosely wound from the inner side to the outer side in a spiral shape around the left-hand folding/unfolding direction wound portion 351. Similarly, the folding/unfolding axis winding part 404 of the FPC 400R.1 is loosely wound from the inner side to the outer side in a spiral shape around the right-hand folding/unfolding direction wound portion 352. Thus, the wiring device is completed. The wiring device is shown in FIG. 9.

The rotating axis winding parts 402 of FPCs are tightened by rotation of the upper unit 200 in the same direction as a winding direction thereof. On the other hand, when the upper unit 200 rotates in inverse direction, the rotating axis winding parts 402 are loosened. This is true with respect to the folding/unfolding axis winding parts 404 and 406. Therefore, the FPC merely receives small stress when the upper unit 200 is folded/unfolded and/or rotated in relation to the lower unit 100. This lengthens the lifetimes of the FPCs 400L.1 and 400R.1.

For the small stress given to each FPC, it is desirable that the number of turns of each winding parts 402, 404 or 406 is equal to or more than two. In particular, two or three is desirable in consideration of the loosed winding diameter of each winding parts.

Figure 10:
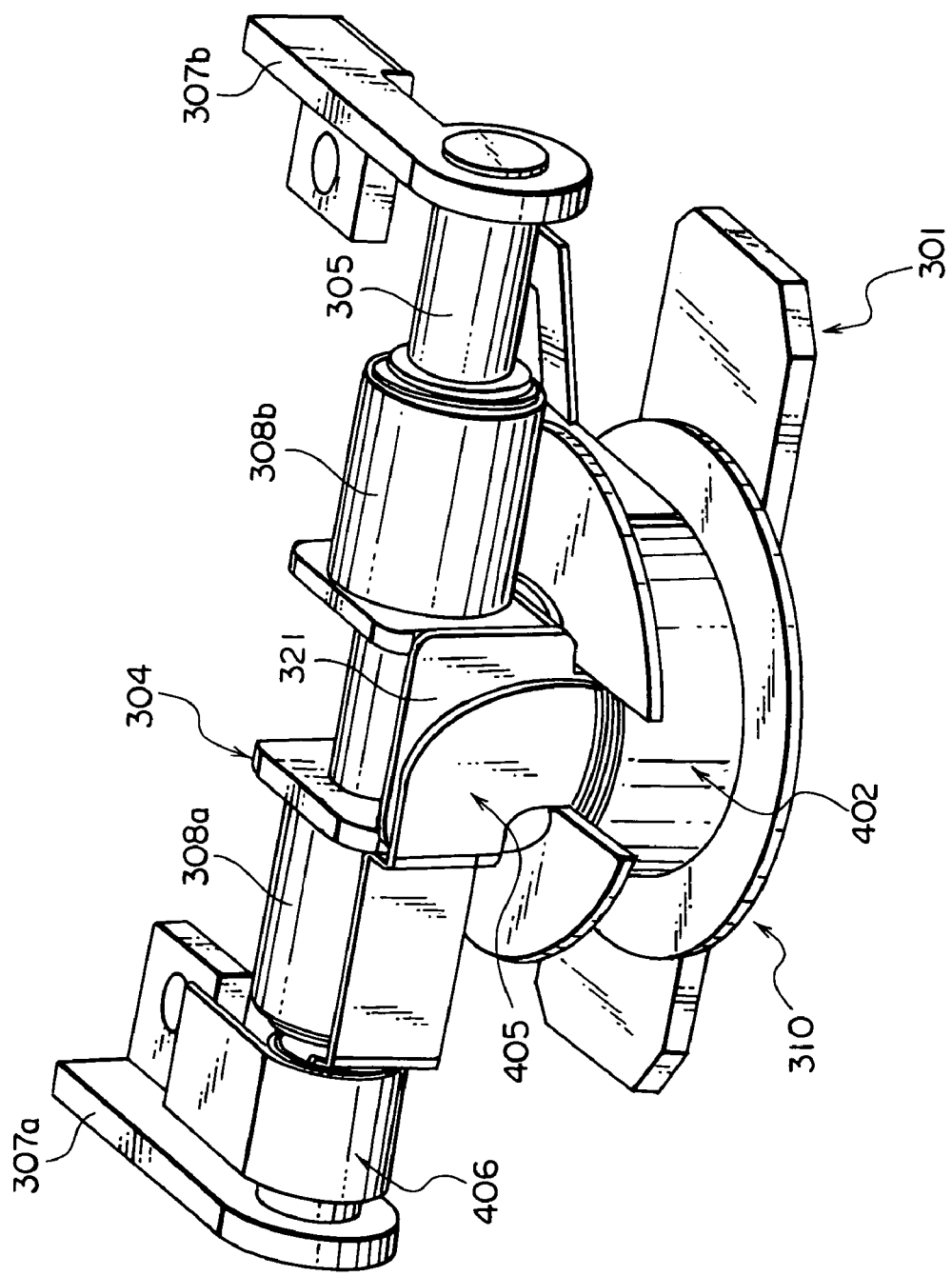
FIG. 10 is an oblique perspective view of the wiring device with one left-side FPC.
Figure 11:
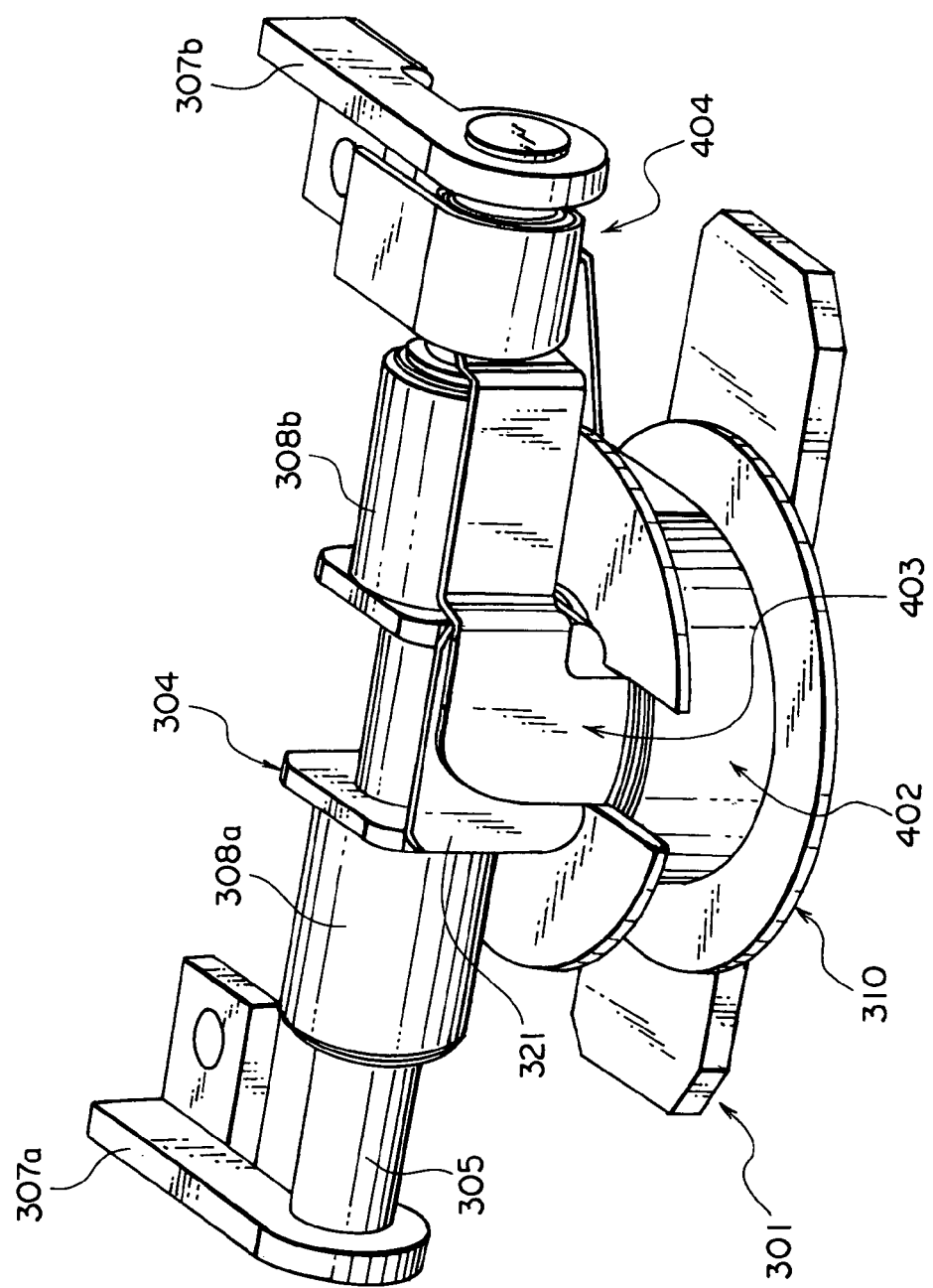
FIG. 11 is an oblique perspective view of the wiring device with one right-side FPC.

The wiring device mentioned above has two FPCs. However, the number of FPCs is not limited to two in this embodiment. For instance, as shown in FIG. 10 or 11, the only left-side or right side FPC maybe included in the wiring device. Furthermore, the wiring device may have three or more FPCs. For example, the four FPCs illustrated in FIGS. 7A-7D can be used. When the three or more FPCs is used, the FPCs for the left-side folding/unfolding direction wound portion 351 and the FPCs for the right-side folding/unfolding direction wound portion 352 are alternately laid.

Thus, the hinge structure of this embodiment can deal with various numbers of FPCs without modification thereof. Therefore, it is unnecessary to widen a width of one FPC because a plurality FPCs can be used for a large number of signal lines. Use of the wide FPC needs long rotating axis and long folding/unfolding axis. However, the hinge structure of this embodiment is not actually affected by the number of signal lines because the plural FPCs having a predetermined width can be used.

Additionally, if the folding/unfolding shaft 305 is reduced in diameter at the left-hand and the right-hand folding/unfolding direction wound portions 351 and 352, the folding mobile phone can be made smaller and thinner since the winding diameter of the FPC wound around the take-up portions 351 and 352 can be made smaller.

Figure 12:
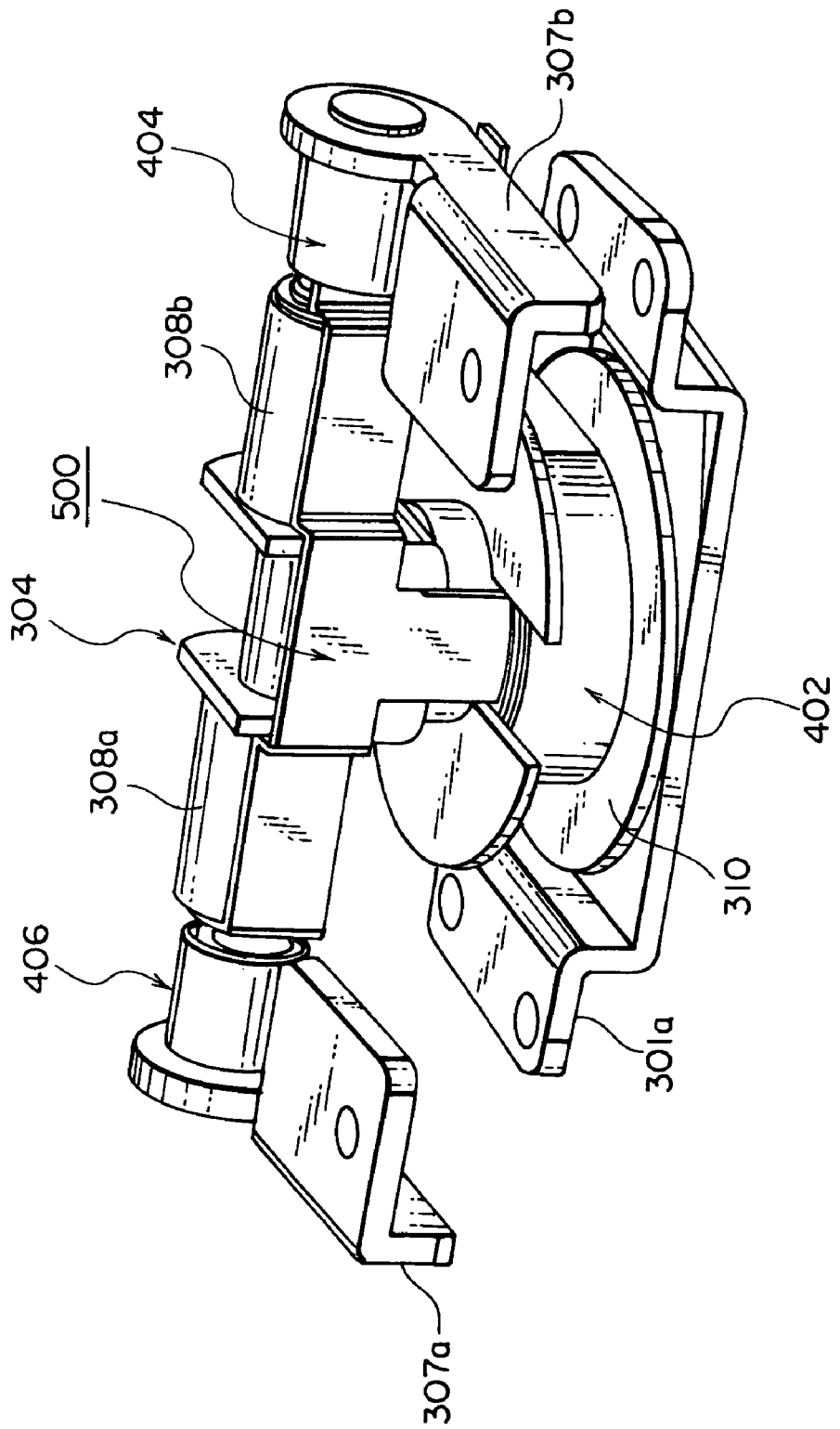
FIG. 12 is an oblique perspective view of the wiring device with a T-shaped FPC.
Figure 13:
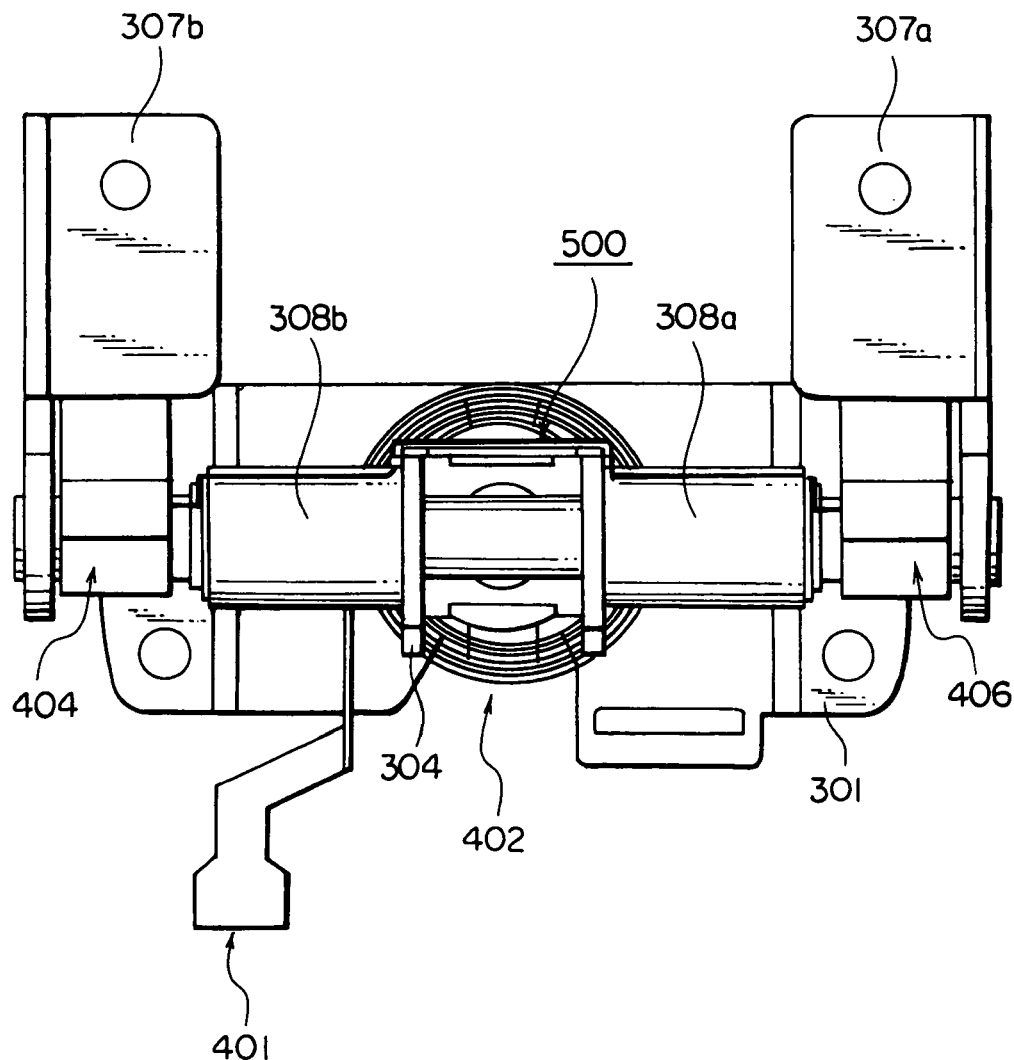
FIG. 13 is a plane view of the wiring device of FIG. 12.

Still furthermore, a T shaped FPC may be used with the hinge structure. The T shaped FPC is, for example, a form such that the FPC 400R.1 of FIG. 4A is laid on the FPC 400L.1. The T shaped FPC combined with the hinge mechanism is illustrated in FIGS. 12 and 13. FIGS. 12 and 13 are an oblique perspective view and a plane view of the hinge mechanism with the T shaped FPC. Two or more T shape FPC may be also used with the hinge structure.

While this invention has thus far been described in conjunction with the preferred embodiment thereof, it will readily be possible for those skilled in the art to put this invention into practice in various other manners.

For example, the hinge structure may be used for a folding small size information device (or portable information terminal) such as a personal digital assistant (PDA).

What is claimed is:

1. A wiring device for use in a folding portable device including an upper unit, a lower unit and a hinge unit mechanically connecting said upper unit to said lower unit, said hinge unit having a rotating axis for rotating said upper unit in relation to said lower unit and a folding/unfolding axis perpendicular to the rotating axis for folding/unfolding said upper unit in relation to said lower unit, said wiring device comprising:

rotative direction wound portion having a first central axis corresponding to the rotating axis for being wound with a first part of a flexible printed cable which electrically connects said upper unit to said lower unit;

a folding/unfolding direction wound portion having a second central axis corresponding to the folding/unfolding axis for being wound with a second part of said flexible printed cable; and a cable fixing portion for fixing said flexible printed cable to said hinge unit.

2. A wiring device as claimed in claim 1, wherein said rotative direction wound portion has a pair of winding guides for guiding said first part of said flexible printed cable; and wherein said folding/unfolding direction wound portion has another pair of winding guides for guiding said second part of said flexible printed cable.

3. A wiring device as claimed in claim 1, wherein said hinge unit has a folding/unfolding shaft with a thinner part thinner than the other part thereof to be used for said folding/unfolding direction wound portion.

4. A wiring device as claimed in claim 1, wherein said cable fixing portion comprises:

a holding member for holding a third part of said flexible printed cable; and a fixing member for fixing said holding member to said hinge unit.

5. A wiring device as claimed in claim 4, wherein said holding member keeps said third part of said flexible printed cable from coming in contact with a moving part of said hinge unit.

6. A wiring device for use in a folding portable device including an upper unit, a lower unit and a hinge unit mechanically connecting said upper unit to said lower unit, said hinge unit having a rotating axis for rotating said upper unit in relation to said lower unit and a folding/unfolding axis perpendicular to the rotating axis for folding/unfolding said upper unit in relation to said lower unit, said wiring device comprising:

a rotative direction wound portion having a first central axis corresponding to the rotating axis for being wound with a first part of a flexible printed cable which electrically connects said upper unit to said lower unit;

a folding/unfolding direction wound portion having a second central axis corresponding to the folding/unfolding axis for being wound with a second part of said flexible printed cable; and a cable fixing portion for fixing a third part between said first part and said second part of said flexible printed cable.

7. A wiring device as claimed in claim 6, wherein said hinge portion comprises a folding/unfolding shaft having a pair of end portions; and wherein said folding/unfolding direction wound portion is provided at each of said end portions of said folding/unfolding shaft.

8. A wiring device as claimed in claim 7, further comprising said flexible printed cable, wherein said second portion of said flexible printed cable is wound around said folding/unfolding direction wound portion at either of said end portions of said folding/unfolding shaft.

9. A wiring device as claimed in claim 8, wherein said flexible printed cable has a spread shape so that said first part thereof is wound around said rotative direction wound portion, and that said second part thereof is wound around said folding/unfolding direction wound portion, and that said third part is extended from said rotative wound portion to said folding/unfolding direction wound portion through said cable fixing portion.

10. A wiring device as claimed in claim 7, further comprising said flexible printed cable having a fourth part continuing from said third part thereof, wherein said second part of said flexible printed cable is wound around said folding/unfolding direction wound portion at one of said end portions of said folding/unfolding shaft while said fourth part of said flexible printed cable is wound around said folding/unfolding direction wound portion at the other of said end portions of said folding/unfolding shaft.

11. A wiring device as claimed in claim 6, wherein said cable fixing portion comprises:

a holding member for holding said third part of said flexible printed cable; and a fixing member for fixing said holding member to said hinge unit.

12. A wiring device as claimed in claim 11, wherein said cable holding portion has a T shape, and wherein said fixing member fixes said holding member to said hinge unit so that a horizontal bar of the T shape corresponds to the folding/unfolding axis and that a vertical bar of the T shape corresponds to the rotating axis.

13. A wiring device as claimed in claim 6, wherein said rotative direction wound portion has a pair of winding guides for guiding said first part of said flexible printed cable; and said folding/unfolding axis winding portion has another pair of winding guides for guiding said second part of said flexible printed cable.

14. A wiring device as claimed in claim 6, wherein said hinge unit has a folding/unfolding shaft with a central axis corresponding to the folding/unfolding axis, said folding/unfolding shaft having a thinner part thinner than the other part thereof to be used for said folding/unfolding direction wound portion.

15. A wiring method for wiring a flexible printed cable between an upper unit and a lower unit of a folding portable device, said upper unit and said lower unit mechanically connected to each other by a hinge unit having a rotating axis for rotating said upper unit in relation to said lower unit and a folding/unfolding axis perpendicular to the rotating axis for folding/unfolding said upper unit in relation to said lower unit, comprising the steps of winding a first winding part of said flexible printed cable around a rotative direction wound portion having a first central axis corresponding to the rotating axis;

winding a second winding part, of said flexible printed cable around a folding/unfolding direction wound portion having a second central axis corresponding to the folding/unfolding axis, and fixing a predetermined part of said flexible printed cable that lies between the first and second winding parts to said hinge unit using a cable fixing portion suitable for attachment to the hinge unit.

16. A folding portable device including an upper unit, a lower unit and a hinge unit for mechanically connecting said upper unit to said lower unit, said hinge unit having a rotating axis for rotating said upper unit in relation to said lower unit and a folding/unfolding axis perpendicular to the rotating axis for folding/unfolding said upper unit in relation to said lower unit, said folding portable device comprising:
- a flexible printed cable for electrically connecting said upper unit to said lower unit;
- a rotative direction wound portion having a first central axis corresponding to the rotating axis for being wound with a first part of said flexible printed cable around the rotating axis; and
- a folding/unfolding direction wound portion having a second central axis corresponding to the folding/unfolding axis for being wound with a second part of said flexible printed cable around the folding/unfolding; and
- a cable fixing portion for fixing said flexible printed cable to said hinge unit.

17. A wiring device as claimed in claim 16, wherein said rotative direction wound portion has a pair of winding guides for guiding said first part of said flexible printed cable; and
said folding/unfolding direction wound portion has another pair of winding guides for guiding said second part of said flexible printed cable.

18. A wiring device as claimed in claim 16, wherein said hinge unit has a folding/unfolding shaft with a thinner part thinner than the other part thereof to be used for said folding/unfolding axis winding portion.

19. A wiring device as claimed in claim 16, wherein said cable fixing portion comprises:
- a holding member for holding a third part of said flexible printed cable; and
- a fixing member for fixing said holding member to said hinge unit.

20. A wiring device as claimed in claim 19, wherein said holding member keeps said third part of said flexible printed cable from coming in contact with a moving part of said hinge unit.

* * * * *